United States Patent
Tsuda et al.

(10) Patent No.: US 6,586,779 B2
(45) Date of Patent: Jul. 1, 2003

(54) LIGHT EMITTING NITRIDE SEMICONDUCTOR DEVICE, AND LIGHT EMITTING APPARATUS AND PICKUP DEVICE USING THE SAME

(75) Inventors: Yuhzoh Tsuda, Tenri (JP); Shigetoshi Ito, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/128,490

(22) Filed: Apr. 24, 2002

(65) Prior Publication Data

US 2002/0158249 A1 Oct. 31, 2002

Related U.S. Application Data

(63) Continuation of application No. 09/947,346, filed on Sep. 7, 2001.

(30) Foreign Application Priority Data

Sep. 8, 2000 (JP) .................................... 2000-272513

(51) Int. Cl.[7] .............................................. H01L 33/00
(52) U.S. Cl. .......................... 257/103; 257/79; 257/98; 257/101; 257/102; 257/103
(58) Field of Search ............................. 257/79, 98, 101, 257/103, 102

(56) References Cited

FOREIGN PATENT DOCUMENTS

| JP | A864870 | 3/1996 |
|---|---|---|
| JP | A10270804 | 10/1998 |

*Primary Examiner*—David Nelms
*Assistant Examiner*—Mai-Huong Tran
(74) *Attorney, Agent, or Firm*—Birch, Stewart, Kolasch & Birch, LLP.

(57) ABSTRACT

There is provided a light emitting device having high luminous efficacy or emission intensity. The device includes a light emitting layer provided between n- and p-type layers of nitride semiconductor formed on a GaN substrate. The light emitting layer is formed of a well layer or a combination of well and barrier layers. The well layer is made of a nitride semiconductor containing an element X, N and Ga, wherein X is As, P or Sb. The ratio of the number of the atoms of element X to the sum of the number of the atoms of element X and N, is not more than 30 atomic percent. The well layer contains Mg, Be, Zn, Cd, C, Si, Ge, Sn, O, S, Se or Te as an impurity for improving the crystallinity of the well layer.

3 Claims, 8 Drawing Sheets

<1-100> AZIMUTH

LIGHT EMITTING NITRIDE SEMICONDUCTOR DEVICE, AND LIGHT EMITTING APPARATUS AND PICKUP DEVICE USING THE SAME

This application is a continuation of application Ser. No. 09/947,346, filed on Sep. 7, 2001, now U.S. Pat. No. 6,399,966 the entire contents of which are hereby incorporated by reference and for which priority is claimed under 35 U.S.C. §120; and this application claims priority of application Ser. No. 2000-272513 filed in Japan on Sep. 8, 2000 under 35 U.S.C. §119.

BACKGROUND OF THE INVENTION

1. Field of the Invention

The present invention relates to light emitting nitride semiconductor devices having high luminous efficacy, and light emitting apparatus and optical pickup devices employing the same.

2. Description of the Background Art

Japanese Patent Laying-Open No. 8-64870 discloses a light emitting device having a stack of gallium nitride based compound semiconductor layers, wherein an active layer is formed of a gallium nitride based compound semiconductor in which the nitrogen is partially replaced with phosphorus and/or arsenic and the active layer is doped with at least one dopant selected from the group consisting of Mg, Zn, Cd, Be, Ca, Mn, Si, Se, S, Ge and Te. In this prior art, the active layer is doped for the purpose of making the emission wavelength longer. According to the publication, the dopant introduced into the active layer allows a different emission level to be generated in the energy band of the crystal, resulting in a longer emission wavelength. The half-width of the emission intensity spectrum relative to the emission wavelength can also be changed depending on the combination of the dopants. If, for example, Zn and Se are the dopants, an emission level as ZnSe can be established, which is different from the level produced by doping Zn or Se and also different from a simple sum of the levels by Zn and Se. The publication, however, does not disclose any specific amount of the dopant(s) introduced into the active layer. The publication only discloses a light emitting device formed on a sapphire substrate specifically. The publication also fails to note the crystallinity of each layer formed on the substrate.

Japanese Patent Laying-Open No. 10-270804 discloses a light emitting nitride semiconductor device having a light emitting layer (an active layer) with a multi quantum well structure formed of GaNAs, GaNP or GaNSb well layer/GaN barrier layer. In this publication, a sapphire ($\alpha$-$Al_2O_3$) substrate and a SiC substrate are examples of the substrate. The publication does not disclose any doped active layer.

The light emitting layer formed of GaNAs, GaNP or GaNSb crystal can provide smaller effective mass of electrons and holes as compared with InGaN crystal conventionally used. This suggests that a population inversion for lasing can be obtained by a small carrier density (and that a lasing threshold current value can be reduced). If, however, As is contained in the light emitting layer of nitride semiconductor, the light emitting layer can readily be separated into a higher nitrogen content region and a higher As content region. Hereinafter this phenomenon will be referred to as "composition separation". The crystal system can further be separated into a hexagonal system of the higher nitrogen content region and the cubic system of the higher As content region. Such a separation into different crystal systems (hereinafter referred to as "crystal system separation") can result in a reduced luminous efficacy due to the degraded crystallinity. Such crystal system separation can be occurred in a P- or Sb-containing light emitting nitride semiconductor layer as well as in the As-containing layer. Thus, it has been desired that such crystal system separation should be prevented for improved luminous efficacy (or emission intensity).

SUMMARY OF THE INVENTION

An object of the present invention is to provide a light emitting device having a higher luminous efficacy or emission intensity by clarifying a structure capable of enhancing the performance of the light emitting device using a light emitting layer of nitride semiconductor containing at least one of As, P and Sb.

The present inventors have found that the crystal system separation due to As, P or Sb contained in the light emitting nitride semiconductor layer can be reduced by doping the light emitting layer with an impurity of at least one element of Mg, Be, Zn, Cd, C, Si, Ge, Sn, O, S, Se and Te, so that the light emitting nitride semiconductor device can have a good crystallinity and a high luminous efficacy (or emission intensity).

Thus, the present invention is directed to a light emitting nitride semiconductor device including: one of a substrate made of nitride semiconductor crystal and a substrate having a nitride semiconductor crystal film grown on a crystalline material other than the nitride semiconductor crystal; an n-type layer and a p-type layer each made of nitride semiconductor formed on the substrate; and a light emitting layer provided between the n- and p-type layers. The light emitting layer is formed of a well layer or a combination of well and barrier layers. Of the layer(s) forming the light emitting layer, at least the well layer is made of a nitride semiconductor containing an element X, N and Ga, wherein the element X is at least one selected from the group consisting of As, P and Sb. In the nitride semiconductor forming the light emitting layer, the ratio of the number of element X atoms to the total number of the element X atoms and N atoms, is not more than 30 atomic percent. Of the layer(s) forming the light emitting layer, at least the well layer contains as an impurity at least one element selected from the group consisting of Mg, Be, Zn, Cd, C, Si, Ge, Sn, O, S, Se and Te.

In the present invention, the total content of the impurity is $1\times10^{17}$ to $5\times10^{20}/cm^3$.

In the present invention, preferably, the nitride semiconductor crystal or the nitride semiconductor crystal film of the substrate, or the light emitting nitride semiconductor device has a threading dislocation density of not more than $3\times10^7/cm^2$ or an etch pit density of not more than $7\times10^7/cm^2$.

In the present invention, typically, the light emitting layer may be a multi-quantum well layer.

The present invention is also directed to a light emitting apparatus comprising the light emitting nitride semiconductor device as aforementioned and having an emission wavelength of 380 nm to 650 nm.

The present invention is also directed to an optical pickup apparatus including a light emission apparatus comprising the light emitting nitride semiconductor device as aforementioned and having an oscillation wavelength of 380 nm to 420 nm.

The foregoing and other objects, features, aspects and advantages of the present invention will become more apparent from the following detailed description of the present invention when taken in conjunction with the accompanying drawings.

Figure 1:
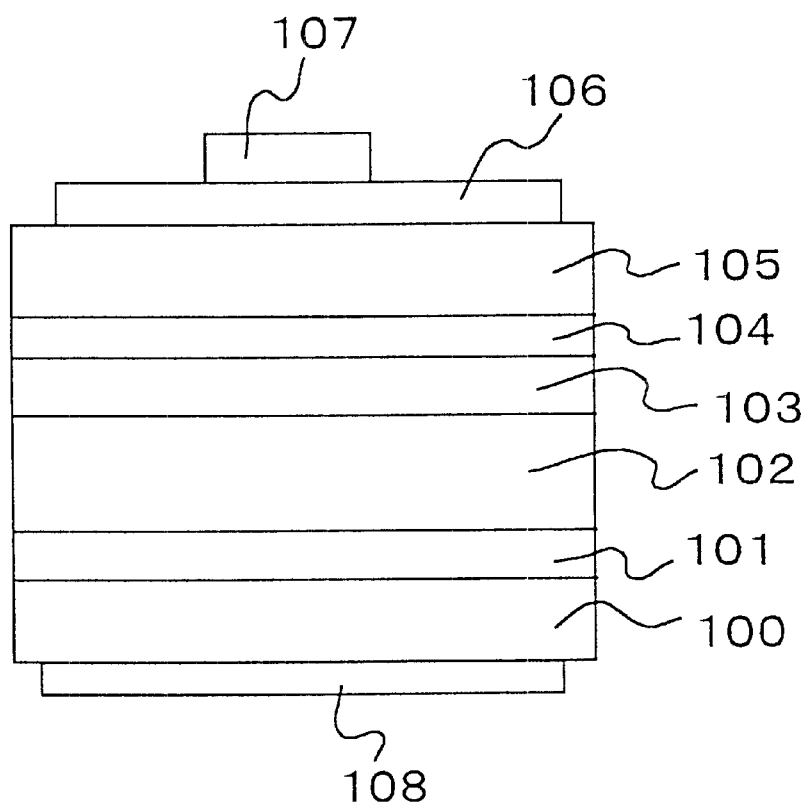
FIG. 1 is a schematic cross section of an example of a light emitting diode device grown on a nitride semiconductor substrate.

In the figures, an n-type GaN substrate is represented by a reference numeral 100, a low temperature GaN buffer layer by 101, an n-type GaN layer by 102, a light emitting layer by 103, a p-type $Al_{0.1}Ga_{0.9}N$ carrier block layer by 104, a p-type GaN contact layer by 105, a transparent electrode by 106, a p electrode by 107, an n electrode by 108, a dielectric film by 109, a quasi GaN substrate by 200 and 200a, a seed substrate by 201, a low temperature buffer layer by 202, an n-type GaN film by 203, a first n-type GaN film by 203a, a second n-type GaN film by 203b, an anti-growth film by 204, an n-type GaN thick film by 205, the center of the width of the anti-growth film by 206, the center of the width of the anti-growth film free portion by 207, the center of the width of a groove by 208, the center of the width of the groove free portion, i.e., a plateau by 209, a substrate by 300, an n-type GaN substrate by 400, a low temperature GaN buffer layer by 401, an n-type $Al_{0.05}Ga_{0.95}N$ layer by 402, an n-type $In_{0.07}Ga_{0.93}N$ anti-crack layer by 403, an n-type $Al_{0.1}Ga_{0.9}N$ clad layer by 404, an n-type GaN optical guide layer by 405, a light emitting layer by 406, a p-type $Al_{0.2}Ga_{0.8}N$ carrier block layer by 407, a p-type GaN optical guide layer by 408, a p-type $Al_{0.1}Ga_{0.9}N$ clad layer by 409, a p-type GaN contact layer by 410, an n electrode by 411, a p electrode by 412, and a $SiO_2$ dielectric film by 413.

DESCRIPTION OF THE PREFERRED EMBODIMENTS

The device according to the present invention has a substrate made of nitride semiconductor crystal (hereinafter referred to as a "nitride semiconductor substrate") or a substrate having a nitride semiconductor crystal film grown on a crystalline material other than the nitride semiconductor crystal (hereinafter referred to as a "quasi nitride semiconductor substrate"). The nitride semiconductor substrate generally has a low dislocation density such as $10^7/cm^2$ or less. Thus the nitride semiconductor substrate may be used to fabricate a light emitting nitride semiconductor device having a small threading dislocation density of at most approximately $3\times10^7/cm^2$, or a small etch pit density of at most approximately $7\times10^7/cm^2$ and hence good crystallinity. Such an effect can also be obtained by employing the quasi nitride semiconductor substrate. If the quasi nitride semiconductor substrate is used, the nitride semiconductor crystal film grown on the different crystalline material preferably has a dislocation density of at most $10^7/cm^2$ to reduce the dislocation density of the device. The dislocation density may be represented by an etch pit density or a threading dislocation density. The etch pit density can be obtained by measuring a pit density on the surface of a test piece such as a substrate which has been immersed in an etchant of 1:3 of phosphoric acid and sulfuric acid (at 250° C.) for 10 minutes. The threading dislocation density can be measured with a transmission electron microscope.

For the light emitting layer containing As, P, Sb, in particular, a high threading dislocation density results in a reduced luminous efficacy and hence an increased threshold current value. This is possibly because As, P, or Sb segregates in the vicinity of the threading dislocation so that the crystallinity can be degraded in the light emitting layer. The use of the nitride semiconductor substrate or the quasi nitride semiconductor substrate can prevent such an increase of a threshold current value and the degradation of the crystallinity in the light emitting layer. The nitride semiconductor substrate is also preferable as it can provide good resonator ends with a small mirror loss through a cleavage process. The nitride semiconductor substrate has high thermal conductivity and thus serves as a good heat sink. The nitride semiconductor substrate and the nitride semiconductor film formed thereon can have substantially the same thermal expansion coefficient, so that the wafer can have little distortion and the yield of chips through the dividing process can be improved. Thus it is particularly preferable to use the nitride semiconductor substrate for the device of the present invention.

Principle of the Present Invention

In the conventional GaNAs well layer, crystal system separation can readily be caused by the As contained in the layer, resulting in degraded crystallinity and reduced luminous efficacy of the light emitting nitride semiconductor device. This crystal system separation can be generated in a GaNP or GaNSb well layer as well as in the GaNAs well layer.

The crystal system separation may be caused by the fact that the rate of the adsorption of As, P or Sb to Ga is extremely higher than that of N to Ga and the fact that the volatility of N is extremely higher than that of As, P or Sb, i.e., N can readily be removed from the crystal. When a Ga source material and an N source material are supplied to grow GaN crystal, at the outermost surface (the epitaxial growth surface) of the growing GaN crystal, a part of the supplied N material is combined with the Ga material to form the GaN, while most of N, having high volatility, readily re-evaporates. The re-evaporation of N results in some Ga failing to form GaN crystal and diffusing in the epitaxial growth surface and then re-evaporating. In such a process, if a source material of As, P or Sb is supplied, the Ga diffusing in the epitaxial growth surface can readily be adsorbed to As, P or Sb, since the rate of the adsorption of As, P or Sb to Ga is extremely higher than that of N to Ga. Thus the Ga—As, Ga—P or Ga—Sb bond is formed more preferentially than the Ga—N bond. In addition, Ga has a long surface migration length, which can give a high probability of the collision of the Ga—As, Ga—P or Ga—Sb bonds. At the collision, the bonds are fixed to facilitate crystallization. This is a segregation effect due to the abovementioned bond. This segregation effect results in a composition separation into a portion with a high content of the bond and a portion with a low content of the bond. When the composition separation has advanced, the portion with the high content of the bond finally forms a cubic crystal system and the portion with the low content of the bond finally forms a hexagonal crystal system. This is referred to as crystal system separation.

In the present invention, the crystal system separation is prevented by doping the light emitting nitride semiconductor layer with at least one of Mg, Be, Zn, Cd, C, Si, Ge, Sn, O, S, Se and Te. The impurity is distributed uniformly across the entire epitaxial growth film to form a nucleus for crystal growth. This nucleus traps the Ga—As, Ga—P or Ga—Sb bond. More specifically, the introduction of the impurity to form the nucleus substantially reduces the surface migration length of Ga. Thus, doping the entire surface of the epitaxial growth film uniformly with the impurity can reduce the collision of the Ga—As, Ga—P or Ga—Sb bonds, so that localized significant crystallization can be prevented (i.e., the segregation effect can be reduced). Thus, the crystal system separation can be prevented to improve the crystallinity of the light emitting layer. The adsorption of the Ga atom to the Group V is described in the above by way of illustration. The above-described mechanism is also applicable to other Group III atoms than Ga.

Figure 8:
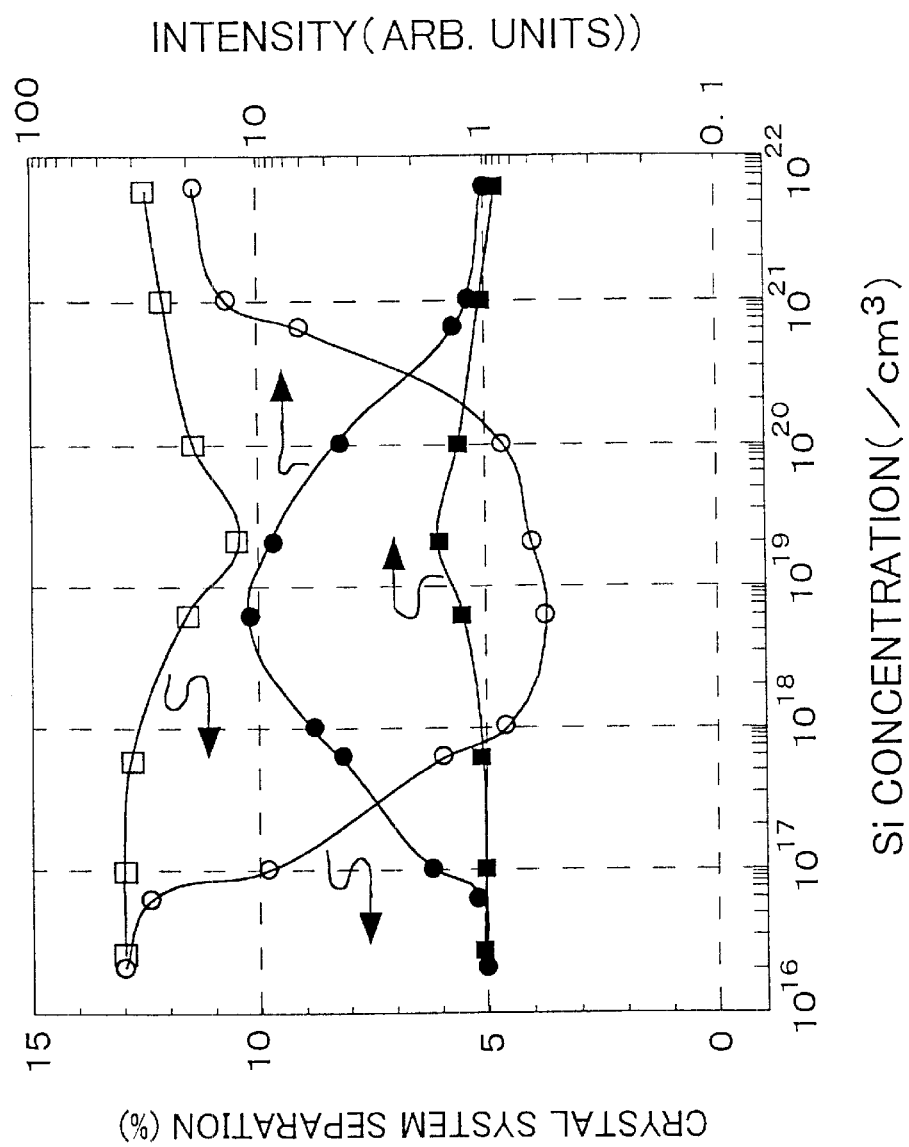
FIG. 8 represents a relationship between the amount of an impurity added to the light emitting layer, and the crystal system separation and the emission intensity of the device.

Relationship Between Doping and Crystal Defects in Light Emitting Layer in the Present Invention The relationship between the doping according to the present invention and the crystal defects (mainly the threading dislocation) will be described referring to FIG. 8. FIG. 8 shows the degree of the crystal system separation generated in a Si-doped $GaN_{0.92}P_{0.08}$ well layer having an emission wavelength of 520 nm, and the emission intensity. Herein the "degree of crystal system separation" refers to the ratio by volume (in percentage) of the portion with the crystal system separation to the crystal system separation free portion (that is formed with the average composition ratio) in a unit volume of the well layer. In FIG. 8, the horizontal axis represents the amount of Si dopant introduced, and the left vertical axis represents the degree (%) of the crystal system separation and the right vertical axis represents the emission intensity in an arbitrary unit. In FIG. 8, the emission intensity is standardized to have a level of one when the well layer is not doped with the impurity. In FIG. 8, the circle represents the characteristics of the light emitting device with the well layer grown on a GaN substrate (an example of the nitride semiconductor substrate), and the square represents the characteristics of the light emitting device with the well layer grown on a sapphire substrate. As shown in the figure, the light emitting device grown on the GaN substrate has a threading dislocation density of approximately $1 \times 10^7/cm^2$ and an etch pit density of not more than approximately $5 \times 10^7/cm^2$, and the light emitting device grown on the sapphire substrate has a threading dislocation density of approximately 1 to $10 \times 10^9/cm^2$ and an etch pit density of not less than approximately $4 \times 10^8/cm^2$. The etch pit density can be obtained by measuring a pit density on the surface of the epitaxial wafer (the light emitting device) which has been immersed in an etchant of 1:3 of phosphoric acid and sulfuric acid (at 250° C.) for 10 minutes. The etch pit density is obtained as a result of measuring the surface of the epitaxial wafer of the light emitting nitride semiconductor device, which is not a result of directly measuring the defects in the light emitting layer. However, if the etch pit density is high, the light emitting layer has a high defect density, and therefore the measured etch pit density will indicate whether the active layer has a large number of defects.

FIG. 8 demonstrates that the crystal system separation can be reduced by the doping according to the present invention more effectively in the light emitting device grown on the GaN substrate than in that grown on the sapphire substrate. The figure also shows that the device on the GaN substrate has greater emission intensity.

As well as the GaN substrate as described above, a substrate having a structure with a GaN crystal film grown on a crystalline material other than GaN crystal (hereinafter referred to as a "quasi GaN substrate") is also preferable. The quasi GaN substrate may be produced as described in detail below. In the nitride semiconductor films grown on the quasi GaN substrate, the smallest threading dislocation density is not more than approximately $3 \times 10^7/cm^2$ and the smallest etch pit density is not more than approximately $7 \times 10^7/cm^2$. These values are close to those of the nitride semiconductor film grown on the GaN substrate. However, the quasi GaN substrate has different portions with low and high threading dislocation densities in a mixed manner and therefore it can provide a lower yield of the light emitting device than the GaN substrate (the nitride semiconductor substrate). In the light emitting device grown on the quasi GaN substrate, the relationship between the amount of Si dopant introduced and the degree of the crystal system separation and the device's emission intensity is almost the same as that in the GaN substrate as shown in FIG. 8. If the quasi GaN substrate is used, to obtain such a result as shown in FIG. 8, the light emitting device is desirably grown on portions with less crystal defects (or less threading dislocations).

Thus it has been found that the emission intensity of the light emitting device with less crystal defects (mainly threading dislocations) is greater than that with more crystal defects, even if both devices contain the impurity in the same concentration. Thus the crystal defects may also trap the Ga—As, Ga—P or Ga—Sb bond as well as the nucleus formation by the impurity. However, the function of the crystal defects to trap the bond is significantly greater than that of the nucleus formation by the impurity and therefore the crystal defects may promote the segregation rather than reduce the crystal system separation. The crystal defects are not uniform and the threading dislocation, which is a main defect of the crystal defects, is in the form of a pipe having a diameter on the order of several nm to several tens nm. Such crystal defects may cause a significant segregation effect. In contrast, the nucleus formation by the impurity should be distributed uniformly across the entire epitaxial growth film.

As can be seen from the foregoing, in order to improve the emission intensity, it is desirable that the light emitting layer is doped with the impurity and the GaN substrate (the nitride semiconductor substrate) or the quasi GaN substrate is used for the light emitting device. It has also been found that a threading dislocation of not more than approximately $3 \times 10^7/cm^2$ or an etch pit density of not more than approximately $7 \times 10^7/cm^2$ significantly improve the effect of introducing the impurity in the present invention.

The obtained characteristics of the device having a light emitting nitride semiconductor layer containing any one of As, P and Sb are similar to those as shown in FIG. 8. A similar effect can also be obtained when Si dopant is replaced by Mg, Be, Zn, Cd, C, Ge, Sn, O, S, Se or Te dopant.

Impurity in Well Layer According to the Present Invention and Its Amount

A description will now be provided of the impurity and its amount to be introduced to produce the effect of the present invention.

Initially, experiments are carried out to reveal the amount of As, P or Sb for causing the above-described crystal system separation. As a result, when the GaN crystal is doped with As, P or Sb of $1\times10^{18}/cm^2$ or more, the crystal system separation starts (with a crystal system separation degree of approximately 2 to 3%), and the degree attains to approximately 12 to 13% when the number of the element atoms introduced amounts to approximately 10 atomic percent of the total number of the Group V element atoms in the nitride semiconductor.

Referring again to FIG. 8, the relationship between the amount of the impurity introduced, and the crystal system separation and the emission intensity will be described. In the figure, as indicated by hollow circles, the degree of the crystal system separation started to decrease (to 10% or less) at a dopant amount of approximately $1\times10^{17}/cm^3$, was approximately 6% or less at approximately $5\times10^{17}/cm^3$, started to gradually increase at approximately $2\times10^{19}/cm^3$, abruptly increased at more than $1\times10^{20}/cm^3$, and was 10% or more at more than $5\times10^{20}/cm^3$. On the other hand, as indicated by solid circles, similarly, the emission intensity started to increase at a dopant amount of approximately $1\times10^{17}/cm^3$, abruptly increased at approximately $5\times10^{17}/cm^3$, had a peak around $5\times10^{18}/cm^3$, started to gradually decrease around $2\times10^{19}/cm^3$, abruptly decrease at more than $1\times10^{20}/cm^3$, and was no longer superior at more than $5\times10^{20}/cm^3$. This shows that there is a correlation between the crystal system separation and the emission intensity.

In FIG. 8, as indicated by the circles, the crystal system separation was not prevented at a dopant amount of less than $1\times10^{17}/cm^3$. This maybe because at such a dopant amount, the residual crystal defects can trap As, P or Sb more strongly than the impurity. On the other hand, the crystal system separation started to gradually increase at a dopant amount of more than $2\times10^{19}/cm^3$. This may be because the crystallinity of the light emitting layer is degraded by the doping itself.

As can be seen from the detail of FIG. 8, also in the light emitting device grown on a sapphire substrate, which is indicated by squares, the degree of the crystal system separation gradually decreases as the impurity is introduced, and the emission intensity accordingly gradually increases. Such an effect of reducing the crystal system separation is, however, different from that of the device on the GaN substrate. The light emitting device grown on the sapphire substrate has a threading dislocation density higher than that on the GaN substrate, so that it cannot efficiently exhibit the effect of the introduced impurity. If the impurity concentration is not higher than that in the device on the GaN substrate, the crystal system separation cannot be reduced effectively. As for the squares, it was expected that the crystal system separation would further be reduced by doping at not less than approximately $2\times10^{19}/cm^3$. In fact, however, the degree of the crystal system separation increases as shown in FIG. 8. The excessively introduced impurity seems to degrade the crystallinity so significantly that the crystal system separation increases.

Thus, for a high emission intensity or luminous efficacy in the light emitting device using a GaN substrate or a quasi GaN substrate with a low threading dislocation, the degree of the crystal system separation is preferably not more than 10%, and more preferably not more than approximately 6%. Such a degree of the crystal system separation can be obtained by introducing the impurity of $1\times10^{17}/cm^3$ to $5\times10^{20}/cm^3$ and preferably $5\times10^{17}/cm^3$ to $1\times10^{20}/cm^3$.

A similar effect was also obtained when the Si dopant was replaced by Mg, Be, Zn, Cd, C, Ge, Sn, O, S, Se or Te dopant. When a plurality kinds of the above dopants were introduced, a similar effect was also obtained. If a plurality kinds of dopants are introduced, the total amount thereof is desirably $1\times10^{17}/cm^3$ to $5\times10^{20}/cm^3$.

A barrier layer may be doped or may not be doped, since the barrier layer does not directly contribute to the light emitting through the recombination of the injected carriers. If the barrier layer contains at least one of As, P and Sb, however, preferably it is doped with the impurity as well as the well layer. By doing so, the crystallinity of the barrier layer can also be improved, as described above.

Impurity in the Present Invention

The impurity suitable for the present invention is Mg, Be, Zn, Cd, C, Si, Ge, Sn, O, S, Se or Te. These impurity elements are generally classified into Group II elements Be, Mg, Zn, Cd, Group IV elements C, Si, Ge, Sn, and Group VI elements O, S, Se, Te.

The ionic bonding of Group IV elements is weaker than that of Group II or VI elements (to be close to covalent bond) and it mainly, simply inhibits a Ga—As, Ga—P or Ga—Sb bond from diffusing in the surface (or substantially reduces the surface migration length). A part of the ionic bonding of Group IV elements is less substituted by the impurity as compared with the case of the Group II or VI elements. In the case of the Group IV elements, therefore, the sift level of the emission wavelength is not so significant, and the collision of the bonding and the localized large crystallization can be prevented (i.e., the effect of reducing the crystal system separation can be obtained) only by controlling the amount of the impurity.

Of the Group IV elements, Si is particularly preferable and C and Ge are the next preferable elements in order of decreasing the single-bond energy to N. If the element has a higher single-bond energy to N, such an element hardly combines with N. In the present invention, the crystal system separation is prevented by reducing the segregation of As, P or Sb. In the present invention, the impurity that adsorbs As, P, Sb rather than N is preferably used.

The Group II elements forms positive ions and thus not only inhibit the Ga—As, Ga—P or Ga—Sb bond from diffusing in the surface but attract and adsorb the bond. Therefore, the amount of the Group II element introduced for efficiently preventing the crystal system separation can be smaller than that of the Group IV element. In the case of the Group II elements, the degree of the crystal separation started to decrease at a dopant amount of approximately $5\times10^{16}/cm^3$, was minimum around $1\times10^{18}/cm^3$, and started to increase around $1\times10^{20}/cm^3$ or more. If the amount of the impurity introduced is small, the degradation of the crystallinity by the doping itself can be reduced.

The Group III elements (such as Al, Ga or In) that can combine with As, P or Sb can be replaced with the Group II impurity. When such replacement is occurred, As, P or Sb remains in the crystal and the other Group III elements can re-evaporate, so that the emission wavelength of the light emitting device can be sifted to a somewhat longer wavelength. In the case that the Group II elements are used for doping, therefore, it can be more difficult to obtain the targeted emission wavelength through the process as compared with the case that the Group IV elements are used for doping. If, however, the light emitting layer should contain so much As, P or Sb that the mixed crystal content can be high (i.e., a long-wavelength light emitting device of approximately 450 nm or more should be produced), the control of the amount of the Group II element introduced can be easier than the control of the amount of the supplied As, P or Sb source material. This is because in such a case, a proportional relationship cannot be established between the amount of the supplied As, P or Sb material and the composition ratio of the light emitting layer.

The Group VI elements forms negative ions and therefore they not only inhibit the Ga—As, Ga—P or Ga—Sb bond from diffusing in the surface but attract and adsorb the bond effectively. Therefore, the amount of the Group VI element introduced for efficiently preventing the crystal system separation can be smaller than that of the Group IV element. In the case of the Group VI elements, for example, the degree of the crystal separation started to decrease at a dopant amount of approximately $5 \times 10^{16}/cm^3$, was minimum around $1 \times 10^{18}/cm^3$, and started to increase around $1 \times 10^{20}/cm^3$ or more. If the amount of the impurity introduced is small, the degradation of the crystallinity by the doping itself can be reduced.

The Group V elements (such as P, As or Sb) that can combine with the Group III element such as Ga can be replaced with the Group VI impurity. When such replacement is occurred, As, P or Sb re-evaporates from the crystal, so that the emission wavelength of the light emitting device can be sifted to a somewhat shorter wavelength. In the case that the Group VI elements are used for doping, therefore, it can be more difficult to obtain the targeted emission wavelength through the process as compared with the case that the Group IV elements are used for doping. If, however, the content of As, P or Sb in the light emitting layer should be so low that the mixed crystal content can be low (i.e., a short-wavelength light emitting device of approximately 450 nm or less should be produced), the control of the amount of the Group VI element introduced can be easier than the control of the amount of the supplied As, P or Sb source material. This is because As, P or Sb is less volatile that N and can be easily incorporated into the light emitting layer.

Preferable impurities for the As or P containing light emitting layer will be described below.

Impurities for As-containing Light Emitting Layer

If the light emitting layer contains As, Ge or Si is most preferable dopant, which is the Group IV element. Because the covalent bond radii of Ge and Si (approximately 0.122 nm and approximately 0.117 nm, respectively) are close to that of As (approximately 0.121 nm), Ge and Si seems to be able to trap As readily and appropriately.

Second preferable is Mg or Zn, which is the Group II element. The ionic radii of Mg and Zn are approximately 0.065 nm and 0.074 nm, respectively, which are close to that of Ga (0.062 nm), which is a Group III element and a main component of the light emitting layer. Thus if Ga is replaced with Mg or Zn as described above, defects or distortion can preferably be reduced in the light emitting layer.

Third preferable is C, which is the Group IV element. The covalent bonding radius of C is approximately 0.077 nm, which is significantly close to that of N (0.070 nm), which a Group V element and a main component of the light emitting. Therefore, if the light emitting layer is made of C dopant containing nitride semiconductor crystal, distortion or defects of the crystal due to the doping can be reduced due to its covalent bonding radius significantly close to that of N, a main component of the light emitting layer.

Impurities for P-containing Light Emitting Layer

If the light emitting layer contains P, Si is most preferable dopant, which is the Group IV element. Because the covalent bond radius of Si (approximately 0.117 nm) is close to that of P (approximately 0.110 nm), Si seems to be able to trap P readily and appropriately.

Second preferable is Mg or Zn, which is the Group II element. The ionic radii of Mg and Zn are approximately 0.065 nm and 0.074 nm, respectively, which are close to that of Ga (0.062 nm), which is a Group III element and a main component of the light emitting layer. Thus if Ga is replaced with Mg or Zn as described above, defects or distortion can preferably be reduced in the light emitting layer.

Third preferable is C, which is the Group IV element. The covalent bonding radius of C is approximately 0.077 nm, which is significantly close to that of N (0.070 nm), which a Group V element and a main component of the light emitting. Therefore, if the light emitting layer is made of C dopant containing nitride semiconductor crystal, distortion or defects of the crystal due to the doping can be reduced due to its covalent bonding radius significantly close to that of N, a main component of the light emitting layer.

Process of Introducing the Impurity

In the process of introducing the impurity, the impurity may be introduced before the light emitting layer (a well layer or a barrier layer) is formed, or the impurity may be introduced in the growth process of the light emitting layer (a well layer or a barrier layer).

In the former manner, i.e., when the impurity is used before the growth process of the light emitting layer, the impurity can form a crystal nucleus before the light emitting layer is grown. Thus, the crystal system separation can be prevented efficiently from the initial stage of forming the light emitting layer. This can prevent the light emitting layer from being affected by the underlying layer and from having the crystal system separation. The former manner is effective in the case that the As, P or Sb containing light emitting layer has a relatively small thickness.

In the latter manner, i.e., when the impurity is introduced during the growth of the light emitting layer, the impurity forms a crystal nucleus in the process of the light emitting layer growth, so that the crystal system separation slightly remains in the light emitting layer. In this case, however, the introduction of the impurity synchronized with the growth of the light emitting layer can provide respective layers with the crystal system separations prevented in the same manner in the crystal growth direction. That is, in the latter manner, the local generation of an intensive crystal system separation can be prevented in the light emitting layer, so that the crystallinity can be uniform over the layer. Thus the latter manner is effective in growing a thick light emitting layer.

Preferably, the impurity is dispersed in the light emitting layer uniformly. This can effectively reduce the substantial surface migration length of the Ga—As, Ga—P or Ga—Sb bond and thus prevent the bond from being locally fixed into segregation. The impurity is preferably introduced by the method using a gaseous impurity material, such as MOCVD.

Light Emitting Layer for the Present Invention

In the present invention, the light emitting layer may be formed simply of a well layer, or it may have a structure in which well and barrier layers are stacked alternately. In the present invention, of the layers constituting the light emitting layer, at least the well layer is made of a nitride semiconductor containing an element X that is at least one selected from the group consisting of As, P and Sb. If the light emitting layer is composed of the combination of well and barrier layers, only the well layer(s) may be formed of such a nitride semiconductor or the well and barrier layers may be formed of such a nitride semiconductor. Such a nitride semiconductor further contains Ga and N. In such a nitride semiconductor, element X has an atomic fraction smaller than N. Additionally, in such a nitride semiconductor, the ratio of the number $N_1$ of element X to the total number of number $N_1$, and the number $N_2$ of element N, is not more than 30 atomic percent, preferably not more than 20 atomic percent. The layer formed of such a nitride semiconductor (the well layer or the well and barrier layers) preferably has an element X concentration of not less than $1 \times 10^{18}/cm^3$. If $\{N_1/(N_1+N_2)\} \times 100(\%)$ exceeds 30%, the introduction of the impurity cannot achieve sufficient prevention of the crystal system separation and the crystallinity of the light emitting layer is degraded. If $\{N_1/(N_1+N_2)\} \times 100(\%)$ is not more than 20%, the impurity introduced can prevent the crystal system separation more effectively. If the element X concentration is not less than $1 \times 10^{18}/cm^3$, the introduction of the impurity can significantly restrain the crystal system separation. Such a composition of the nitride semiconductor can restrain the crystal system separation as described above to make the crystallinity of the well layer good, resulting in a high emission intensity or a low lasing threshold current density. A similar mechanism can be applied to the barrier layer, although the barrier layer is not required to contain As, P or Sb and it is only required to have a greater band gap energy than the well layer.

In the present invention, the nitride semiconductor forming at least the well layer can typically be represented by the formula $In_xAl_yGa_{1-x-y}N_tAs_uP_vSb_z$, wherein $0 \leq x < 1$, $0 \leq y < 1$, and $0 < u+v+z < 1$. In the formula, $t+u+v+z$ may be one. At least one of u, v and z is not zero. $(u+v+z)/(u+v+z+t)$ is not more than 0.3 and preferably not more than 0.2.

Thickness of Light Emitting Layer

In the present invention, the well layer is preferably 0.4 nm to 20 nm in thickness. If the well layer has a thickness smaller than 0.4 nm, a carrier confinement level by the quantum well effect can be too high such that the luminous efficacy can be reduced. If the well layer has a thickness greater than 20 nm, crystallinity is degraded, depending on the As, P, Sb content in the well layer.

In the present invention, the barrier layer is preferably 1 nm to 20 nm in thickness. If the barrier layer has a thickness smaller than 1 nm, carriers might be confined insufficiently. If the barrier layer has a thickness greater than 20 nm, it would be difficult to form a subband structure for the multi quantum well layer.

Structure of Light Emitting layer

In the present invention, the light emitting layer is typically composed of the combination of the well and barrier layers as shown in Table 1. Alternatively, the light emitting layer may have a composition containing the Group III element(s) presented in Table 1 and N, and two or more additional elements selected from the group consisting of As, P and Sb. The total content of the additional elements relative to all of the Group V elements forming the light emitting layer, is not more than 30 atomic percent, preferably not more than 20 atomic percent. In Table 1, for the light emitting layer in the present invention, the triangle indicates applicable combinations, the circle indicates preferable combinations, and the double circle indicates most preferable combinations. If the light emitting layer has a mono-quantum well structure formed simply of a well layer, the well layers in Table 1 that contain Sb can be marked by the triangle and the remainder can be marked by the double circles.

TABLE 1

| Well layer | Barrier layer | | | | | | | | |
|---|---|---|---|---|---|---|---|---|---|
| | GaN | GaNAs | GaNP | GaNSb | InGaN | InGaNAs | InGaNP | InGaNSb | AlGaN |
| GaNAs | ⊙ | ○ | ○ | △ | ⊙ | ○ | ○ | △ | ○ |
| GaNP | ⊙ | ○ | ○ | △ | ⊙ | ○ | ○ | △ | ○ |
| GaNSb | △ | △ | △ | △ | △ | △ | △ | △ | △ |
| InGaNAs | ⊙ | ○ | ○ | △ | ⊙ | ○ | ○ | △ | ○ |
| InGaNP | ⊙ | ○ | ○ | △ | ⊙ | ○ | ○ | △ | ○ |
| InGaNSb | △ | △ | △ | △ | △ | △ | △ | △ | △ |
| AlGaNAs | ⊙ | ○ | ○ | △ | ⊙ | △ | △ | △ | ⊙ |
| AlGaNP | ⊙ | ○ | ○ | △ | ⊙ | △ | △ | △ | ⊙ |
| AlGaNSb | △ | △ | △ | △ | △ | △ | △ | △ | △ |
| InAlGaNAs | ⊙ | ○ | ○ | △ | ⊙ | △ | △ | △ | ⊙ |
| InAlGaNP | ⊙ | ○ | ○ | △ | ⊙ | △ | △ | △ | ⊙ |
| InAlGaNSb | △ | △ | △ | △ | △ | △ | △ | △ | △ |

| Well layer | AlGaNAs | AlGaNP | AlGaNSb | InAlGaN | InAlGaNAs | InAlGaNP | InAlGaNSb |
|---|---|---|---|---|---|---|---|
| GaNAs | △ | △ | △ | ○ | △ | △ | △ |
| GaNP | △ | △ | △ | ○ | △ | △ | △ |
| GaNSb | △ | △ | △ | △ | △ | △ | △ |
| InGaNAs | △ | △ | △ | ○ | △ | △ | △ |
| InGaNP | △ | △ | △ | ○ | △ | △ | △ |
| InGaNSb | △ | △ | △ | △ | △ | △ | △ |
| AlGaNAs | ○ | ○ | △ | ○ | △ | △ | △ |
| AlGaNP | ○ | ○ | △ | ○ | △ | △ | △ |
| AlGaNSb | △ | △ | △ | △ | △ | △ | △ |
| InAlGaNAs | ○ | ○ | △ | ⊙ | ○ | ○ | △ |

TABLE 1-continued

| | | | | Barrier layer | | | |
|---|---|---|---|---|---|---|---|
| InAlGaNP | ○ | ○ | Δ | ◉ | ○ | ○ | Δ |
| InAlGaNSb | Δ | Δ | Δ | Δ | Δ | Δ | Δ |

◉ . . . a most preferable combination of well + barrier layers for the light emitting layer of the present invention
○ . . . a preferable combination of well + barrier layers for the light emitting layer of the present invention
Δ . . . a combination of well + barrier layers for the light emitting layer of the present invention As described above, the addition of the impurity to the As, P or Sb containing light emitting layer can reduce the crystal system separation and improve the sharpness of the interface between the well and barrier layers. This facilitates fabricating the combinations of the well and barrier layers presented in Table 1 (multi-quantum well structures). In contrast, a conventional, impurity-free light emitting layer contains portions having different crystal systems in a mixed manner, so that the sharpness of the interface between its well and barrier layers gets significantly worse as the number of the stacked light emitting layers increases. Such degradation in the sharpness of the interface makes it difficult to fabricate a multilayered structure (a multi-quantum well structure) itself and the light emitting layer also provides an unevenness of color and reduced emission intensity. According to the present invention, such disadvantage of the prior art can be overcome by the addition of the impurity to the light emitting nitride semiconductor containing at least one of As, P and Sb and the multi-quantum well structure can easily be formed. Preferably, the multi-quantum well structure provides an emission intensity greater than a mono-quantum well structure and provides a laser diode with a smaller threshold current density. More specific compositions of the well and barrier layers forming the light emitting layer will be described below.

GaNX Well Layer (X is As, P, Sb or Any Combination Thereof)

If a well layer is formed of GaNX crystal, it does not contain In and is thus free of the In segregation-induced composition separation. The In composition separation herein means that a single layer is separated into a region with a high In content and a region with a low In content (and the regions are mixed in the layer). The well layer free of the In-induced composition separation does not have a non-light emitting region caused by a high In content and it can preferably be free of a factor increasing the threshold current value of the device.

Of GaNX crystals, the 3-element mixed crystal of GaNAs, GaNP or GaNSb has a composition easier to control than the 4-element mixed crystal of GaNAsP and the 5-element mixed crystal of GaNAsPSb. Thus the targeted wavelength can be obtained in a good reproducibility. Of P, As and Sb, P has a atomic radius (a Van der Waals radius or covalent bond radius) closest to that of N and therefore it can displace a portion of the N atoms in the mixed crystal more easily than As and Sb. Thus GaN with P added thereto, or GaNP, can have good crystallinity. This suggests that an increased P content in GaNP may not so severely degrade the crystallinity of the mixed crystal. When the light emitting device uses a GaNP well layer, the GaNP crystal can cover a wide emission wavelength range from ultra violet light emission to red light emission.

Of P, As, and Sb, Sb has the largest atomic radius (or Van der Waals radius or covalent bond radius) relative to that of N, and as compared to As and Sb, it has a weaker tendency to displace a portion of the N atoms in the mixed crystal. However, the Sb atomic radius greater than that of As and P can prevent the removal of highly volatile N atoms from the mixed crystal and thus make the crystallinity of GaNSb good.

The atomic radius of As is intermediate between those of P and Sb and therefore GaNAs can preferably have both characteristics of GaNP and GaNSb.

The emission wavelength of the light emitting layer employing the GaNX well layer can be modified by the modulation of the As, P or Sb content ratio in the well layer. For example, to obtain a emission wavelength around UV 380 nm, in $GaN_{1-x}As_x$ x should be 0.001, in $GaN_{1-y}P_y$ y should be 0.01, and in $GaN_{1-z}Sb_z$ z should be 0.02. To obtain an emission wavelength around 410 nm of blue-violet color, in $GaN_{1-x}As_x$ x should be 0.02, in $GaN_{1-y}P_y$ y should be 0.03, and in $GaN_{1-z}Sb_z$ z should be 0.01. To obtain a wavelength around 470 nm of blue color, in $GaN_{1-x}As_x$ x should be 0.03, in $GaN_{1-y}P_y$ y should be 0.06, and in $GaN_{1-z}Sb_z$ z should be 0.02. To obtain a wavelength around 520 nm of green color, in $GaN_{1-x}As_x$ x should be 0.05, in $GaN_{1-y}P_y$ y should be 0.08, and in $GaN_{1-z}Sb_z$ z should be 0.03. To obtain a wavelength around 650 nm of red color, in $GaN_{1-x}As_x$ x should be 0.07, in $GaN_{1-y}P_y$ y should be 0.12, and in $GaN_{1-z}Sb_z$ z should be 0.04. The above composition ratios or near ratios can complete the targeted emission wavelength.

When Al is added to the GaNX well layer, the As, P or Sb content should be higher than that for the aforementioned emission wavelengths, because the Al added increases the band gap energy. The addition of Al to the GaNX well layer is preferable, however, because the crystallinity of the well layer can be improved. The N element in the GaNX well layer is significantly more volatile than As, P and Sb, and N can readily be removed from the crystal, so that the crystallinity of the well layer can be degraded. When Al is added to the GaNX well layer, Al that is highly reactive can strongly combine with N, so that the removal of N from the well layer can be prevented and the degradation in crystallinity can be reduced.

The GaNX well layer is preferably combined with a barrier layer of GaN, GaNAs, GaNP, InGaN, InGaNAs, InGaNP, AlGaN or InAlGaN. Particularly, in GaN, InGaN, AlGaN, which are a 2-element mixed crystal or a 3-element mixed crystal composed of two types of Group III elements and one type of a Group V element, the composition can readily be controlled and therefore desired compounds can be formed in a good reproducibility. In particular, InGaN is preferable as its crystallinity can be better than that of GaN or AlGaN when it is produced at the temperature range for growing the GaNX well layer, such as 600° C. to 800° C. When the barrier layer is made of GaN, the crystallinity of which can be better than that of AlGaN, the interface between the well and barrier layers can be so flat that the luminous efficacy can be improved.

InGaNX Well Layer

When the well layer is formed of InGaNX crystal, it can have the composition separation due to the effect of the In segregation. Like In, however, As, P or Sb can reduce the band gap energy of the well layer, and therefore the In content in the InGaNX well layer can be lower that that in the conventional InGaN well layer to give the targeted emission wavelength. When at least one of As, P and Sb is added to the In-containing well layer, the content of In can be low (so that the composition separation can be reduced) while the well layer can have moderate In segregation. The moderate In segregation can provide a localized level for the trap of the carriers of the electrons and holes, so that the luminous efficacy can be improved and the threshold current value can be lowered.

Of InGaNX crystals, the 4-element mixed crystal of InGaNAs, InGaNP or InGaNSb can have a composition easier to control than the 5-element mixed crystal of InGaNAsP and the 6-element mixed crystal of InGaNAsPSb, so that the targeted emission wavelength can be provided in a good reproducibility.

Of P, As, and Sb, P has an atomic radius (a Van der Waals radius or covalent bond radius) closest to that of N, and as compared to As and Sb, it has a stronger tendency to displace a portion of the N atoms in the mixed crystal. Thus InGaN with P added thereto, or InGaNP, can have a good crystallinity. This suggests that an increased P content in InGaNP may not so severely degrade the crystallinity of the mixed crystal. When the light emitting device uses a InGaNP well layer, the InGaNP crystal can cover a wide emission wavelength range from ultra violet light emission to red light emission.

Of P, As, and Sb, Sb has the largest atomic radius (or Van der Waals radius or covalent bond radius) relative to that of N, and as compared with As or Sb, it has a weaker tendency to displace a portion of the N atoms in the mixed crystal. However, the Sb atomic radius greater than that of As and P can prevent the removal of highly volatile N atoms from the mixed crystal and thus make the crystallinity of InGaNSb good.

The atomic radius of As is intermediate between those of P and Sb and therefore InGaNAs can preferably have both characteristics of InGaNP and InGaNSb.

The emission wavelength of the light emitting layer employing the InGaNX well layer can be modified by the modulation of the As, P or Sb content in the well layer. For example, Table 2 presents a relationship between the compositions of InGaNAs and InGaNP, and the emission wavelength. In preparing the well layer, the compositions shown in Table 2 or near compositions can complete the targeted emission wavelength.

TABLE 2

|  |  | In(y = 0.01) | In(y = 0.02) | In(y = 0.05) | In(y = 0.1) | In(y = 0.2) | In(y = 0.35) |
|---|---|---|---|---|---|---|---|
|  |  | $In_yGa_{1-y}N_{1-x}As_x$ | | | | | |
| Emulsion wavelength | 380 nm | 0.005 | 0.004 | 0.001 | | | |
|  | 400 nm | 0.012 | 0.011 | 0.008 | 0.003 | | |
|  | 410 nm | 0.016 | 0.015 | 0.011 | 0.006 | | |
|  | 470 nm | 0.034 | 0.033 | 0.029 | 0.024 | 0.014 | 0.001 |
|  | 520 nm | 0.046 | 0.045 | 0.041 | 0.036 | 0.025 | 0.012 |
|  | 650 nm | 0.07 | 0.069 | 0.065 | 0.059 | 0.048 | 0.034 |
|  |  | $In_yGa_{1-y}N_{1-x}P_x$ | | | | | |
| Emulsion wavelength | 380 nm | 0.008 | 0.006 | 0.001 | | | |
|  | 400 nm | 0.02 | 0.018 | 0.013 | 0.004 | | |
|  | 410 nm | 0.025 | 0.023 | 0.018 | 0.01 | | |
|  | 470 nm | 0.055 | 0.053 | 0.047 | 0.038 | 0.022 | 0.001 |
|  | 520 nm | 0.075 | 0.073 | 0.067 | 0.058 | 0.041 | 0.019 |
|  | 650 nm | 0.116 | 0.114 | 0.107 | 0.097 | 0.079 | 0.055 |

P content (x) for wavelength of $In_yGa_{1-y}N_{1-x}As_x$ crystal
P content (x) for wavelength of $In_yGa_{1-y}N_{1-x}P_x$ crystal When Al is added to the InGaNX well layer, the In content and the As, P or Sb content should be higher than those for the emission wavelengths as shown in Table 2, because the Al added increases the band gap energy. The addition of Al to the InGaNX well layer is preferable, however, because the crystallinity of the well layer can be improved. The N element in the InGaNX well layer is significantly more volatile than As, P and Sb, and N can readily be removed from the crystal, so that the crystallinity of the well layer can be degraded. When Al is added to the InGaNX well layer, Al that is highly reactive can strongly combine with N, so that the removal of N from the well layer can be inhibited.

The InGaNX well layer is preferably combined with a barrier layer of GaN, GaNAs, GaNP, InGaN, InGaNAs, InGaNP, AlGaN or InAlGaN. Particularly, in GaN, InGaN, AlGaN, which are a 2-element mixed crystal or a 3-element mixed crystal composed of two types of Group III elements and one type of a Group V element, the composition can readily be controlled and therefore desired compounds can be formed in a good reproducibility. In particular, InGaN is preferable as its crystallinity can be better than that of GaN or AlGaN when it is produced at the temperature range for growing the InGaNX well layer, such as 600° C. to 800° C. When the barrier layer is made of GaN, the crystallinity of which can be better than that of AlGaN, the interface between the well and barrier layers can be so flat that the luminous efficacy can be improved.

EXAMPLE 1

A light emitting device having the structure as shown in FIG. 1 was fabricated. Referring to FIG. 1, the light emitting nitride semiconductor diode device is composed of an n-type GaN substrate 100 having the C (0001) plane, a low temperature GaN buffer layer 101 (of 100 nm in thickness), an n-type GaN layer 102 having a thickness of 3 µm and a Si impurity concentration of $1 \times 10^{18}/cm^3$), a light emitting layer 103, a p-type $Al_{0.1}G_{0.9}N$ carrier block layer 104 (having a thickness of 20 nm and a Mg impurity concentration of $6 \times 10^{19}/cm^3$), a p-type GaN contact layer 105 (having a thickness of 0.1 μm and a Mg impurity concentration of $1 \times 10^{20}/cm^3$), a transparent electrode 106, a p electrode 107, and an n electrode 108. The device was fabricated by the following process.

First, in a metal-organic chemical vapor deposition (MOCVD) apparatus, n-type GaN substrate 100 was placed, and $NH_3$ (ammonia) that is a Group V source material, and TMGa (trimethylgallium) or TEGa (tryethylgallium) that is a Group III source material, were used to grow low temperature GaN buffer layer 101 at 550° C. to have a thickness of 100 nm. Then at 1050° C. $SiH_4$ (silane) was added to the source materials and n-type GaN layer 102 (having a Si impurity concentration of $1 \times 10^{18}/cm^3$) of 3 μm in thickness was formed. Then the substrate temperature was decreased to 800° C., and while $SiH_4$ was introduced as a Si impurity source, $PH_3$ or TBP (t-butylphosphine) was introduced as a P source material to grow $GaN_{0.92}P_{0.08}$ light emitting layer 103 of 4 nm thick. This light emitting layer has a single quantum well structure.

If As is added to the light emitting layer, $AsH_3$ or TBAs (t-butylarsine) may be used. If Sb is added to the light emitting layer, TMSb (trimethylantimony) or TESb (triethylantimony) may be used. In forming the light emitting layer, dimethylhydrazine may be used in place of $NH_3$ as the N source material.

Then the substrate temperature was increased again to 1050° C. and TMAl (trimethylaluminum) or TEAl (triethylaluminum) that is a Group III source material was used to grow p-type $Al_{0.1}Ga_{0.9}N$ carrier block layer 104 of 20 nm thick and subsequently grow p-type GaN contact layer 105 of 0.1 μm thick. As the p-type impurity, Mg was added in a concentration of $5 \times 10^{19}/cm^3$ to $2 \times 10^{20}/cm^3$. The source of Mg was $EtCP_2Mg$ (bisethylcyclopentadienylmagnesium). Preferably, p-type GaN contact layer 105 has a p-type impurity concentration increasing as it approaches the location at which transparent electrode 106 is formed. Such an impurity distribution can prevent the crystal defects from being increased by the impurity introduction, and can reduce the contact resistance of the p electrode. A small amount of oxygen may also be added to the p-type layer being grown to remove the hydrogen remaining in the p-type layer, because the hydrogen can interfere with the activation of Mg serving as the p-type impurity.

After p-type GaN contact layer 106 was grown, the atmosphere in the reactor of the MOCVD apparatus was replaced by absolute nitrogen carrier gas and $NH_3$ and the temperature was decreased at a rate of 60° C./minute. After the substrate temperature reached 800° C., the $NH_3$ supply was stopped and the substrate was allowed to stand at 800° C. for five minutes and its temperature was then lowered to room temperature. In this process, the substrate may preferably be held at a temperature of 650° C. to 900° C. and allowed to stand for three to ten minutes. The temperature may also be reduced preferably at a rate of not less than 30° C./minute.

The grown film was evaluated by Raman spectroscopy and it was found that the film already had p-type characteristics (i.e., Mg was already activated) without annealing, a conventional technique for making nitride semiconductor films have p-type conductivity. The contact resistance had already been reduced enough for forming the p electrode. When the conventional annealing to give p-type conductivity was also used, the rate of activated Mg was preferably improved.

Then the epi-wafer was taken out from the MOCVD apparatus and electrodes were formed. Since n-type GaN substrate 100 was used, Hf and Au metal films were deposited on the back surface of substrate 100 in this order to form n electrode 108. The n electrode materials may be replaced by Ti/Al, Ti/Mo, Hf/Al or the like. In particular, Hf is preferably used to reduce the contact resistance of the n electrode.

In forming the p electrode, Pd of 7 nm thick was vapor-deposited for transparent electrode 106 and Au was vapor-deposited for p electrode 107. Alternatively the material for the transparent electrode may be Ni or Pd/Mo, Pd/Pt, Pd/Au, Ni/Au or the like.

Finally, a scriber was used to divide the product into chips. In doing so the scriber was applied on the back surface of n-type GaN substrate 100 (the side having n electrode 108 deposited thereon) to prevent debris from adhering, in the scribing step, to the transparent electrode side for taking light. In the scribing step, the product was divided into chips in such a manner that at least one side of the chip has a cleavage plane of the nitride semiconductor substrate. This prevents the chips from having an abnormal geometry due to chipping, cracking and the like and thus increases yield per wafer.

In the above process, the light emitting nitride semiconductor diode device as shown in FIG. 1 was prepared, with different amounts of dopant Si in the light emitting layer. The obtained device was examined for the emission intensity and the crystal system separation degree in the light emitting layer and the relationship as shown in FIG. 8 was obtained. When the light emitting layer was doped with the impurity (Si) in a concentration of $1 \times 10^{18}/cm^3$, $5 \times 10^{18}/cm^3$, $2 \times 10^{19}/cm^3$, or $1 \times 10^{20}/cm^3$, the device had significantly high emission intensity. Preferable results were obtained in the impurity concentration range from $1 \times 10^{17}$ to $5 \times 10^{20}/cm^3$.

In the device as shown in FIG. 1, the low temperature GaN buffer layer may be replaced with a low temperature $Al_xGa_{1-x}N$ buffer layer, wherein $0 \leq x \leq 1$. Alternatively, the low temperature GaN buffer layer may not be used. If the GaN substrate does not have a preferable surface morphology, however, the low temperature $Al_xGa_{1-x}N$ buffer layer, wherein $0 \leq x \leq 1$, is preferably provided to improve the surface morphology. Herein the "low temperature buffer layer" refers to a buffer layer grown at a temperature of approximately 450 to 600° C. The buffer layer grown in such a temperature range is polycrystalline or amorphous.

In the device shown FIG. 1, the light emitting layer may have a multi-quantum well structure in place of the single quantum well structure. If the layer has a multi-quantum well structure, it may have a structure starting and ending with a barrier layer or a structure starting and ending with a well layer. Not more than 10 well layers preferably gave high intensity of the light emitting diode.

In the device shown in FIG. 1, the p-type $Al_{0.1}Ga_{0.9}N$ carrier block layer may be replaced with an AlGaN layer having an Al content other than 0.1. An increased Al content can preferably enhance the carrier confinement in the well layer. In contrast, the Al content may be reduced within a certain range that the carrier confinement is maintained. In such a case, the carrier mobility in the carrier block layer can preferably be increased and the electrical resistance can preferably be lowered. The carrier block layer is not limited to the 3-element mixed crystal of AlGaN and it may be a 4-element mixed crystal such as AlInGaN, AlGaNP, AlGaNAs or the like.

Figure 4:
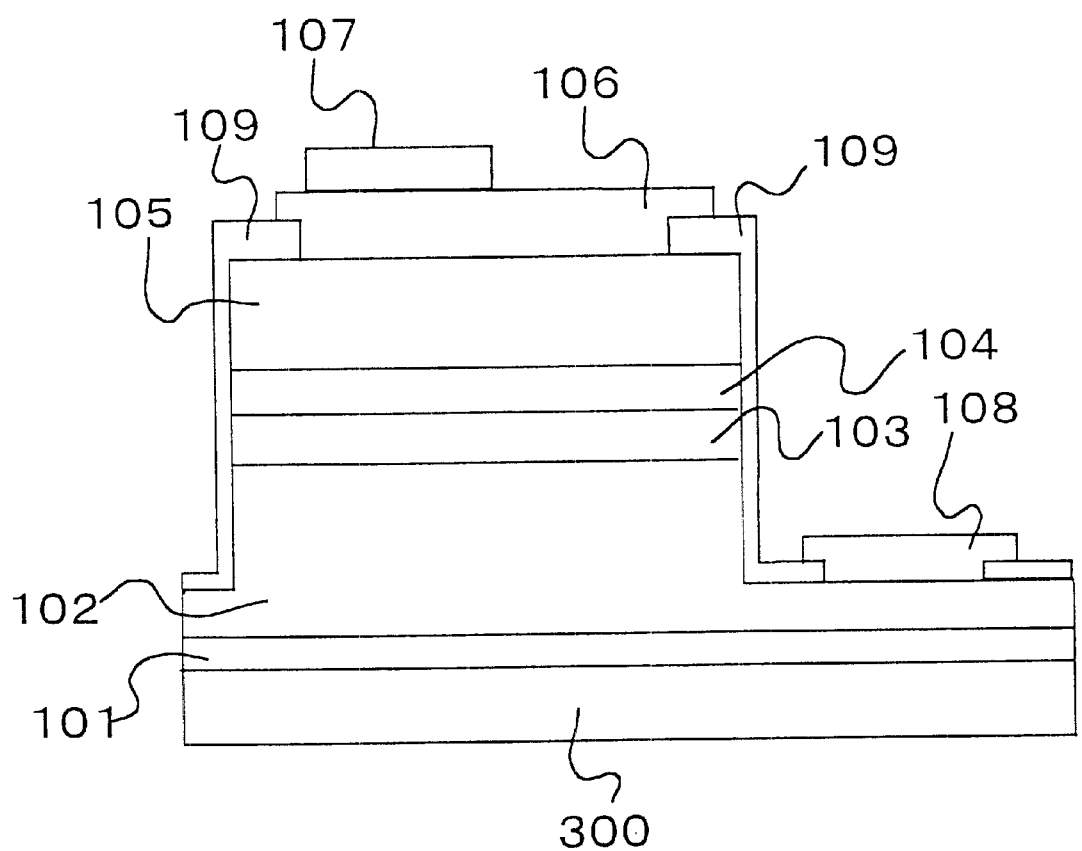
FIG. 4 is a schematic cross section of another example of the light emitting diode device according to the present invention.

In the device according to the present invention, the n electrode may be formed on the n-type GaN layer exposed on the side of the p electrode by dry etching, as shown in FIG. 4.

As regards the crystal plane on which the device structure should be formed, the GaN substrate C (0001) plane may be replaced by the C (000-1) plane, the A {11-20} plane, the R {1-102} plane, the M {1-100} or {1-101} plane. Furthermore, a substrate surface forming an offset angle within two degrees with the above crystal plane can preferably have a good surface morphology. In the present invention, any substrate made of nitride semiconductor, particularly including an $Al_xGa_yIn_zN$ substrate, wherein $0 \leq x \leq 1$, $0 \leq y \leq 1$, $0 \leq z \leq 1$ and $x+y+z=1$, may be used. The substrate may be doped with Si, O, Cl, S, C, Ge, Zn, Cd, Mg or Be. For an n-type nitride semiconductor substrate, Si, O and Cl are particularly preferable.

While the present device is produced by the MOCVD, it may be produced by molecular beam epitaxy (MBE), hydride vapor phase epitaxy (HVPE) or the like.

EXAMPLE 2

Figure 2:
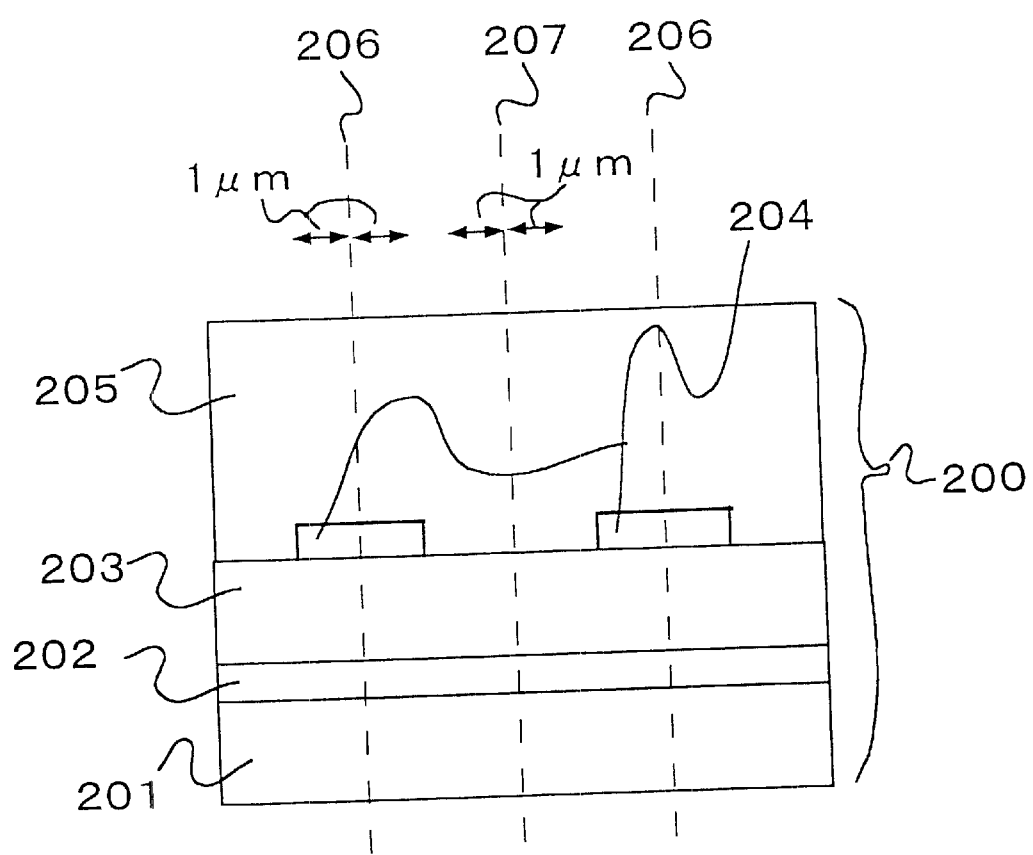
FIG. 2 is a schematic cross section of an example of a quasi GaN substrate.
Figure 3A:
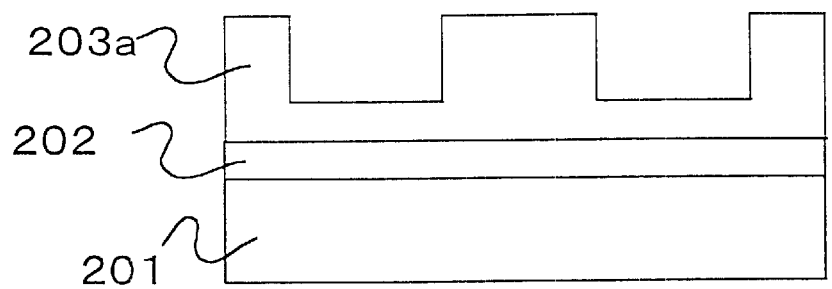
FIG. 3(a) is a schematic cross section showing the process of another example of the quasi GaN substrate.
Figure 3B:
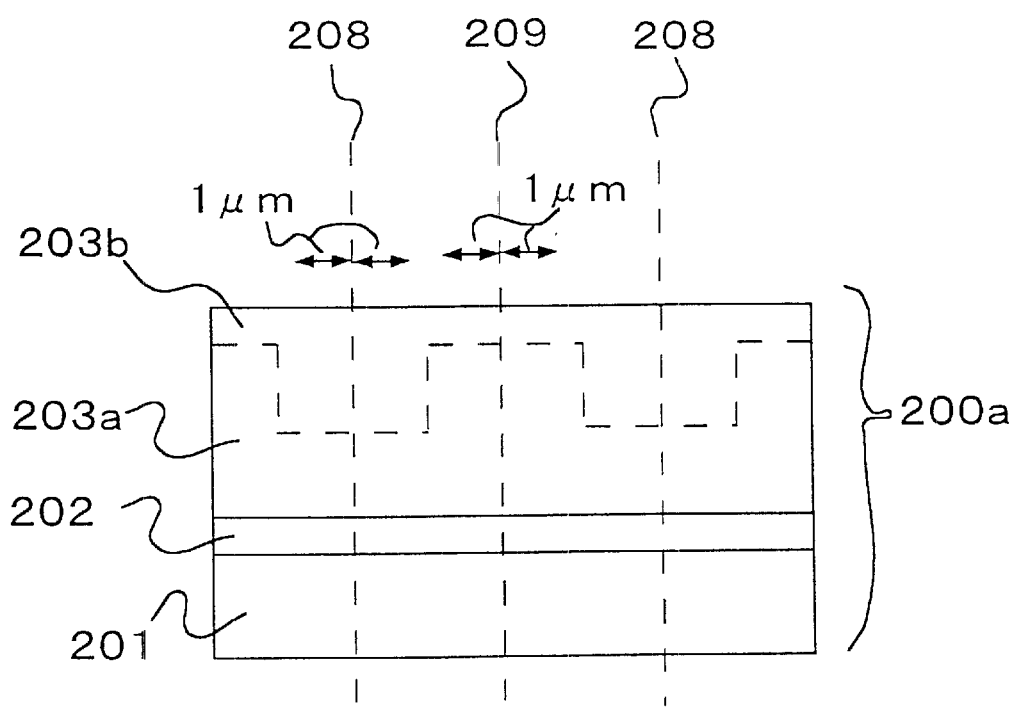
FIG. 3(b) is a schematic cross section showing the completed structure thereof.

A light emitting nitride semiconductor diode was fabricated as in Example 1 except that the GaN substrate 100 shown in FIG. 1 was replaced by a quasi GaN substrate 200 shown in FIG. 2 or a quasi GaN substrate 200a shown in FIG. 3(b) and that, as shown in FIG. 4, the n electrode was formed on the same side as the p electrode. The quasi GaN substrate will be described with reference to FIGS. 2 and 3 and then will be described a light emitting diode employing the quasi GaN substrate.

The quasi GaN substrate 200 shown in FIG. 2 is composed of a seed substrate 201, a low temperature buffer layer 202, an n-type GaN film 203, an anti-growth film 204, and an n-type GaN thick film 205. Quasi GaN substrate 200 has seed substrate 201 other than a nitride semiconductor substrate and seed substrate 201 is used as a base for growing n-type GaN thick film 205. The anti-growth film refers to a film that inhibits nitride semiconductor crystal from being grown directly thereon.

FIG. 3(a) shows an intermediate step in a process of producing quasi GaN substrate 200a and FIG. 3(b) shows complete quasi GaN substrate 200a. The quasi GaN substrate 200a shown in FIG. 3(b) is composed of a seed substrate 201, a low temperature buffer layer 202, a first n-type GaN film 203a and a second n-type GaN film 203b. As shown in FIG. 3(a), initially on seed substrate 201, low temperature buffer layer 202 is formed and thereon the first n-type GaN film 203a is formed and then the surface of GaN film 203a is dry-etched or wet-etched to have a groove. The product is then transported again to the crystal growth apparatus and the second n-type GaN film 203b is deposited to complete quasi GaN substrate 200a (FIG. 3(b)). While, as shown in FIG. 3(a), the substrate has a groove only reaching an intermediate portion of the first n-type GaN film 203a, it may have a groove reaching low temperature buffer layer 202 or seed substrate 201.

When a nitride semiconductor film was grown on quasi GaN substrate 200 or 200a, the obtained film had a dislocation density (a threading dislocation density of approximately $3 \times 10^7/cm^2$ and an etch pit density of approximately $7 \times 10^7/cm^2$), which is lower than that of the film grown on a sapphire substrate, a SiC substrate or the like (a threading dislocation density of approximately 1 to $10 \times 10^9/cm^2$ and an etch pit density of approximately $4 \times 10^8/cm^2$).

The quasi GaN substrate shown in FIG. 2 has a higher threading dislocation density at a portion 206 located exactly above the center of an anti-growth film having a predetermined width and at a portion 207 located exactly above the center of the anti-growth film free portion having a predetermined width. Similarly, the quasi GaN substrate shown in FIG. 3(b) has a higher threading dislocation density at a portion 208 located exactly above the center of the groove having a predetermined width and at a portion 209 located exactly above the center of the groove free portion (plateau portion) having a predetermined width. In contrast, in FIG. 2 a portion located at or near the center between portions 206 and 207 has a lowest threading dislocation density and so does a portion shown in FIG. 3 that is located at or near the center between portions 208 and 209. Thus the quasi GaN substrate has a portion with a high threading dislocation density and a portion with a low threading dislocation density in a mixed manner. Therefore, the quasi substrate is inferior in device yield to the GaN substrate. It is recommendable that a light emitting device should be fabricated at a low threading dislocation region of the quasi GaN substrate.

Specific examples of seed substrate 200 include C-plane sapphire, M-plane sapphire, A-plane sapphire, R-plane sapphire, GaAs, ZnO, MgO, spinel, Ge, Si, 6H-SiC, 4H-SiC, 3C-SiC and the like. Specific examples of anti-growth film 204 can include dielectric films such as $SiO_2$ film, $SiN_x$ film, $TiO_2$ film and $Al_2O_3$ film, and metal films such as tungsten film. Alternatively, a hollow may be provided in place of the anti-growth film.

If the seed substrate is a conductive substrate of SiC, Si or the like, the n electrode may be formed on the back surface of the substrate as shown in the FIG. 1. In this case, however, a high temperature buffer layer should be substituted for the low temperature buffer layer. The high temperature buffer layer refers to a buffer layer grown at not lower than 900° C. It should also contain at least Al, otherwise the nitride semiconductor film with good crystallinity cannot be formed on the SiC or Si substrate. A most preferable material for the high temperature buffer layer is AlN.

The crystal plane of the main surface of the seed may typically be the C {0001} plane, the A {11-20} plane, the R {1-102} plane, the M {1-100} plane, or the {1-101} plane. The substrate surface may preferably form an offset angle within two degrees with the above crystal planes to have a good surface morphology.

Figure 5:
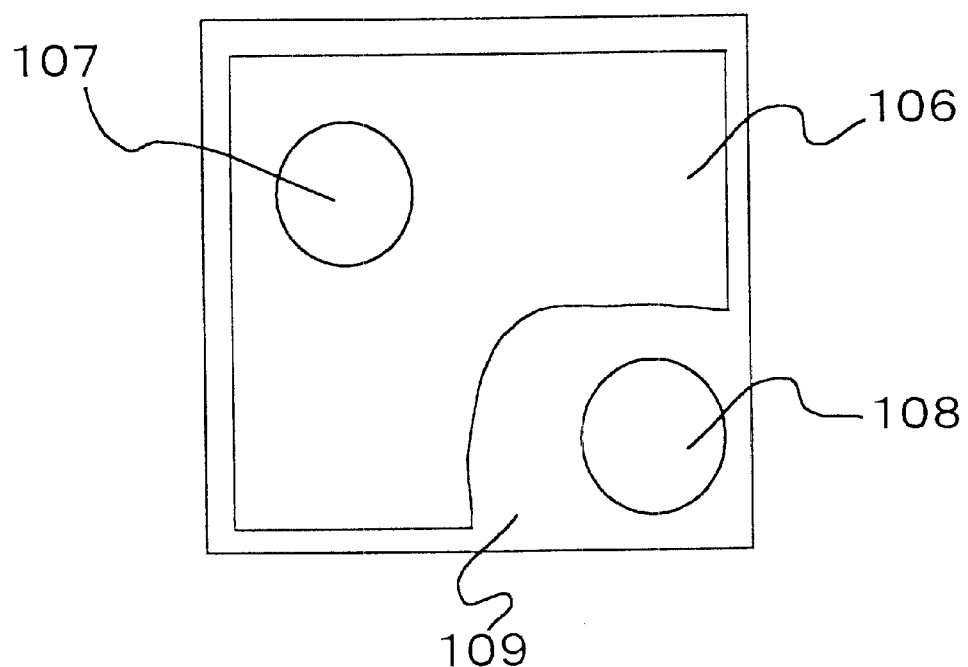
FIG. 5 is a top view of the light emitting diode device shown in FIG. 4.

The quasi GaN substrate was used to fabricate a light emitting diode as shown in FIGS. 4 and 5. FIG. 4 is a cross section of the light emitting diode and FIG. 5 is a top view thereof. As shown in FIG. 4, the light emitting diode is composed of a substrate 300, a low temperature GaN buffer layer 101 (of 50 nm in thickness), an n-type GaN layer 102, a light emitting layer 103, a p-type $Al_{0.1}Ga_{0.9}N$ carrier block layer 104, a p-type GaN contact layer 105, a transparent electrode 106, a p electrode 107, an n electrode 108, and a dielectric film 109. In this diode, substrate 300 has the structure of the quasi GaN substrate 200 in FIG. 2 or that of the quasi GaN substrate 200a in FIG. 3.

The light emitting diode is fabricated in such a manner that at least the portions 206 and 207 in FIG. 2 or the portions 208 and 209 in FIG. 3 are excluded from the diode structure. Preferably, the formation of the light emitting diode starts at a position 1 μm distant in the lateral direction from each centerline of portions 206 and 207 or each centerline of portions 208 and 209. At the portions less than 1 μm distant from each centerline, the threading dislocation density can be relatively high and cracks can readily be caused.

In the device shown in FIG. 4, the low temperature buffer layer may be a low temperature $Al_xGa_{1-x}N$ buffer layer, wherein $0 \leq x \leq 1$. Alternatively, the low temperature GaN buffer layer may be omitted. If the quasi GaN substrate does not have a preferable surface morphology, however, the low temperature $Al_xGa_{1-x}N$ buffer layer, wherein $0 \leq x \leq 1$, is preferably provided to improve the surface morphology.

Alternatively, seed substrate 201 may be removed from quasi GaN substrate 200 or 200a by means of a grinder and the obtained substrate may be used as substrate 300 to fabricate the light emitting device as shown in FIG. 4. Alternatively, low temperature buffer layer 202 and the underlying layer(s) may all be removed from quasi GaN substrate 200 or 200a by means of a grinder and the light emitting device may similarly be fabricated. Alternatively, anti-growth film 204 and the underlying layer(s) may all be removed from quasi GaN substrate 200 or 200a by means of a grinder and the light emitting device may similarly be fabricated. When seed substrate 201 is removed, n electrode 111 can be formed on the back surface of the substrate as shown in the FIG. 1. Alternatively, seed substrate 200 may be removed after the light emitting device is completed.

The crystal system separation that can be caused by doping the light emitting layer with the impurity can efficiently be inhibited in the light emitting device formed on the quasi GaN substrate as shown in FIG. 4. The light emitting device of this example also exhibited characteristics similar to those obtained in Example 1.

EXAMPLE 3

Figure 6:
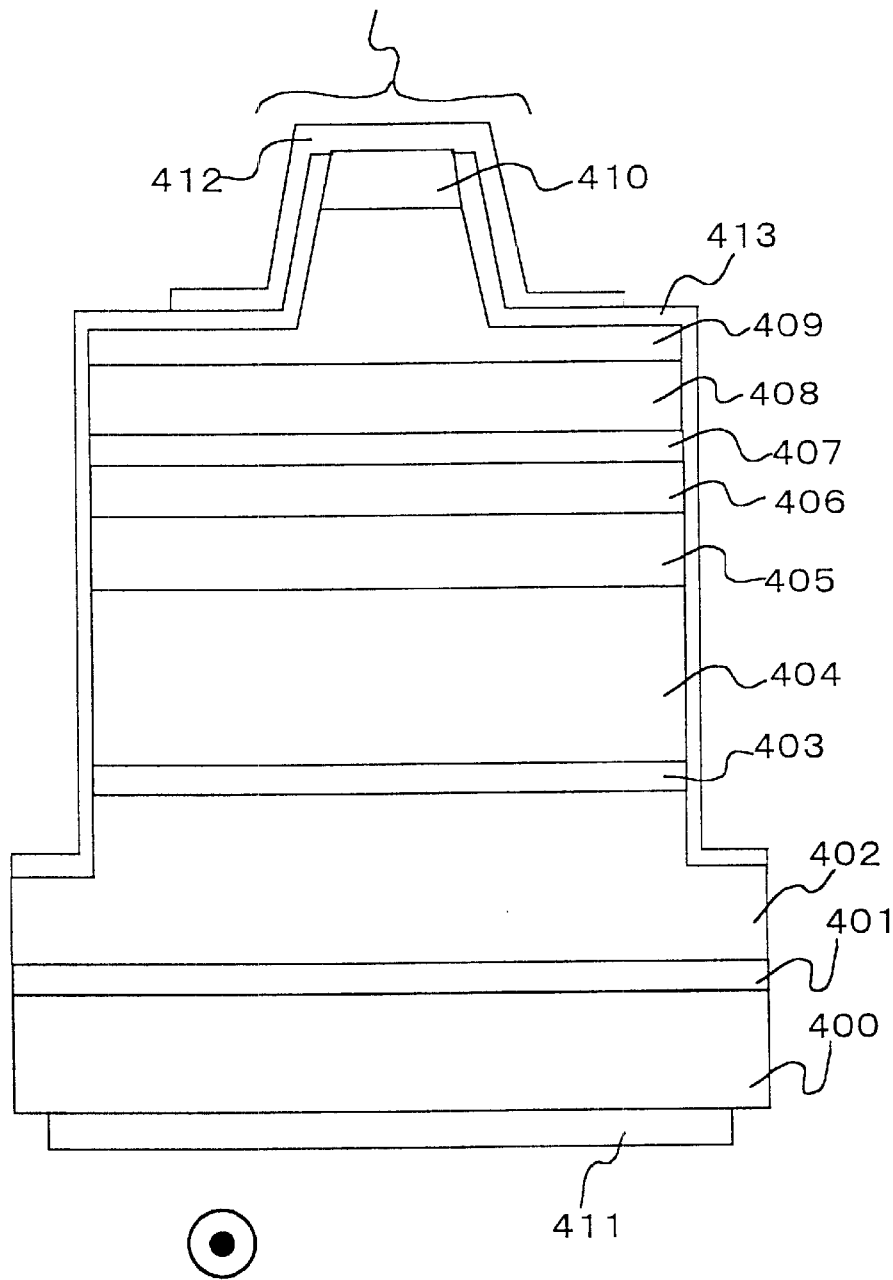
FIG. 6 is a schematic cross section of an example of a laser diode device according to the present invention.

A nitride semiconductor laser diode was fabricated, as shown in FIG. 6. The laser diode shown in FIG. 6 is composed of a C plane (0001), n-type GaN substrate 400, a low temperature GaN buffer layer 401, an n-type $Al_{0.05}Ga_{0.95}N$ layer 402, an n-type $In_{0.07}Ga_{0.93}N$ anti-crack layer 403, an n-type $Al_{0.1}Ga_{0.9}N$ clad layer 404, an n-type GaN optical guide layer 405, a light emitting layer 406, a p-type $Al_{0.2}Ga_{0.8}N$ carrier block layer 407, a p-type GaN optical guide layer 408, a p-type $Al_{0.1}Ga_{0.9}N$ clad layer 409, a p-type GaN contact layer 410, an n electrode 411, a p electrode 412, and a $SiO_2$ dielectric film 413.

While $SiH_4$ was adding to both of the barrier and well layers (in a Si concentration of $1 \times 10^{18}/cm^3$), 4 nm-thick $In_{0.05}Ga_{0.95}N_{0.98}P_{0.02}$ well layer and 6 nm-thick $In_{0.05}Ga_{0.95}N$ barrier layer were grown in three cycles in the order of barrier/well/barrier/well/barrier/well/barrier to form light emitting layer 406 of a multi-quantum well structure. The crystal system separation that can be caused by doping the light emitting layer with the impurity can also be restrained in the obtained semiconductor laser. The semiconductor laser of this example exhibited a low threshold current density.

Low temperature GaN buffer layer 401 may be replaced with a low temperature $Al_xGa_{1-x}N$ buffer layer, wherein $0 \leq x \leq 1$. Alternatively, the low temperature GaN buffer layer may be omitted. If the GaN substrate does not have a preferable surface morphology, the low temperature $Al_xGa_{1-x}N$ buffer layer, wherein $0 \leq x \leq 1$, is preferably provided to improve the surface morphology.

$In_{0.07}Ga_{0.93}N$ anti-crack layer 403 may be replaced with another InGaN layer having an In content of other than 0.07.

Alternatively, the InGaN anti-crack layer may be omitted. If there is a significant lattice mismatch between the clad layer and the GaN substrate, InGaN anti-crack layer should be provided.

The structure of the light emitting layer starting and ending with a barrier layer may be replaced by the structure starting and ending with a well layer. The number of the well layers is not limited to three, and ten or less well layers were able to provide a low threshold current density and to generate continuous oscillation at room temperature. In particular, the devices having two to six well layers preferably had a low threshold current density.

In the process of forming the multi-quantum well structure of the light emitting layer, the 4 nm-thick $In_{0.05}Ga_{0.95}N_{0.98}P_{0.02}$ well layer and 6 nm-thick $In_{0.05}Ga_{0.95}N$ barrier layer may be replaced with different material layers (see the section entitled Structure of Light Emitting Layer). The well layer and the barrier layer may have a thickness of 0.4 nm to 20 nm and a thickness of 1 nm to 20 nm respectively, so that they can have good crystallinity to achieve the effect of the present invention sufficiently.

Since the barrier layer in this example does not contain any of As, P or Sb, the barrier layer may be free of the impurity. Alternatively, as far as the above-described requirements for the impurity are satisfied, an impurity other than Si may be used, or the dose of the impurity may be changed.

P-type $Al_{0.2}Ga_{0.8}N$ carrier block layer 407 may be replaced with an AlGaN layer having an Al content of other then 0.2. Alternatively, the carrier block layer may be omitted. However, the carrier block layer was able to contribute to a lower threshold current density. The carrier block layer can serve to confine the carriers in the light emitting layer. A higher Al content in the carrier block layer can preferably enhance the carrier confinement. On the other hand, the Al content may be reduced within a certain range that the carrier confinement is maintained. In such a case, the carrier mobility in the carrier block layer can preferably be increased and a low electrical resistance can preferably be obtained in the device.

As for the p- and n-type clad layers, $A_{0.1}Ga_{0.9}N$ may be replaced with another 3-element crystal of AlGaN having an Al content of other than 0.1. A higher mixing ratio of Al can provide a larger energy gap and a larger difference of index of refraction between the clad layer and the light emitting layer. In such a case, the carriers and the light can efficiently be confined in the light emitting layer so that the lasing threshold current density can be reduced. The Al content may be reduced within a certain range that the carrier and light confinement is maintained. In such a case, the carrier mobility in the clad layer can preferably be increased and a low electrical resistance can preferably be obtained in the laser device, so that a low operating voltage can be achieved in the device.

Preferably, the AlGaN clad layer has a thickness of 0.7 μm to 1.5 μm. The clad layer with such a thickness can provide the laser devise with a good unimodal, vertical transverse mode and an increased light confinement efficiency, so that the optical characteristics of the laser can be improved and the lasing threshold current density can be reduced.

The clad layer is not limited to the 3-element mixed crystal of AlGaN and it may be a 4-element mixed crystal such as AlInGaN, AlGaNP or AlGaNAs. Alternatively, the p-type clad layer may have a superlattice structure composed of a p-type AlGaN layer and a p-type GaN layer, or of a p-type AlGaN layer and a p-type InGaN layer to reduce the device resistance.

In this example, the effect of the C {0001} plane GaN substrate was similar to that in Example 1. On the other hand, the effect of the quasi GaN substrate in place of the GaN substrate was similar to that in Example 2. If the quasi GaN substrate is used, the ridged stripe as shown in FIG. 6 is preferably formed at a position separate from the portions 206 and 207 in FIG. 2 or separate from the portions 208 and 209 in FIG. 3. More preferably, the ridged stripe is formed at a portion 1 μm distant, in the lateral direction, from each centerline of portions 206 and 207 or from each centerline of portions 208 and 209. The portions less than 1 μm distant in the lateral direction from each centerline can have a high threading dislocation density and can be liable to cause cracks.

EXAMPLE 4

A device was fabricated, as in Examples 1 to 3, except that the light emitting layer was doped with carbon (C) impurity in a concentration of $1 \times 10^{20}/cm^3$. Similar characteristics were obtained.

EXAMPLE 5

A device was fabricated, as in Examples 1 to 3, except that the light emitting layer was doped with Mg impurity in a concentration of $1 \times 10^{17}/cm^3$. Similar characteristics were obtained.

Light Emitting Apparatus

The light emitting nitride semiconductor diode of the present invention can be used to provide a light emitting apparatus, such as a display device, white-light source device or the like. For example, the light emitting diode of the present invention can be employed for at least one of the three primary colors of light, i.e., red, green and blue to provide a display devise.

The amber-color light emitting diode employing a conventional InGaN well layer is not marketable for its poor reliability and low emission intensity. The In content in the conventional InGaN well layer is so high that significant composition separation can be caused by In (i.e., a high In content portion and a low In content portion can be formed). On the other hand, As, P or Sb contained in the light emitting layer can serve to reduce the band gap energy of the light emitting layer (the well layer), like In. Therefore, In can be reduced or omitted by the addition of As, P or Sb to the light emitting layer (the well layer). The conventional nitride semiconductor layer containing at least one of As, P and Sb, however, has crystal system separation as described above, and its crystallinity degraded can result in a low emission intensity. Thus the conventional device cannot derive substantial advantage from As, P or Sb. The crystal system separation and the like can also disturb the interface between the well and barrier layers. Thus the multi-quantum well structure can hardly be fabricated or the light emitting device can have increased unevenness of color or decreased emission intensity.

In the present invention, the impurity added to the light emitting nitride semiconductor layer containing at least one of As, P and Sb can reduce the crystal system separation to overcome the above-described disadvantages. According to the present invention, the crystallinity of the light emitting layer can be improved and the light emitting diode can derive the advantage from As, P or Sb contained in the light emitting layer. The light emitting device according to the present invention can have any emission wavelength in the range of 360 nm to 650 nm. The wave length and the composition of the light emitting layer are exemplarily presented in the above section entitled Structure of Light Emitting Layer.

According to the present invention, light emitting diodes of the three primary colors can be combined together to provide a white-light source device. Alternatively, the light emitting diode of the present invention having an emission wavelength from the UV range to the violet-color range (from 360 nm to 420 nm) may have fluorescent paint applied thereon to provide the white-light source device. Such white-light sources can replace a halogen light source for conventional liquid crystal displays and serve as a backlight with low power consumption and high intensity for the displays. It can be used as a backlight for a liquid crystal display allowing man-machine interface via mobile notebook personal computers, cellular phones and the like. It can provide a miniaturized and clear liquid crystal display.

Optical Pickup Device

The nitride semiconductor laser of the present invention is applicable to optical pickup devices.

The light emitting nitride semiconductor layer according to the present invention contains at least one of As, P and Sb. These elements contained in the light emitting layer can reduce the effective mass of the electrons and the holes in the light emitting layer, and increase the mobility of the electrons and holes. The former suggests that the carrier population inversion for lasing can be generated by a smaller current injection. The latter suggests that if the electrons and holes are consumed by the radiative recombination in the light emitting layer, new electrons and holes can rapidly be injected through diffusion. Thus it was believed that the nitride semiconductor laser with As, P or Sb could have a lower threshold current density and superior self-oscillation characteristics (or lower noise characteristics) as compared with the nitride semiconductor laser completely free of As, P and Sb. If the crystal system separation occurs in the As, P or Sb containing light emitting layer of the nitride semiconductor device, however, it will be difficult to obtain such advantages.

In the present invention, the impurity added to the light emitting nitride semiconductor layer can reduce the crystal system separation. According to the present invention, the light emitting layer can improve in crystallinity and the semiconductor laser can have a low threshold current density accompanied by higher output, and a long life. According to the present invention, a semiconductor laser having superior noise characteristics can be fabricated. For example, a nitride semiconductor laser of the present invention having an oscillation wavelength of 380 to 420 nm can have a lower lasing threshold current density, a smaller amount of spontaneous emission light in the laser light, and less susceptible to noise as compared with a conventional InGaN-based nitride semiconductor laser. The present semiconductor laser can reliably work under a high power (e.g. 50 mW) and a high-temperature ambient. Such a laser is suitable for an optical disc for high density recording and reproduction.

Figure 7:
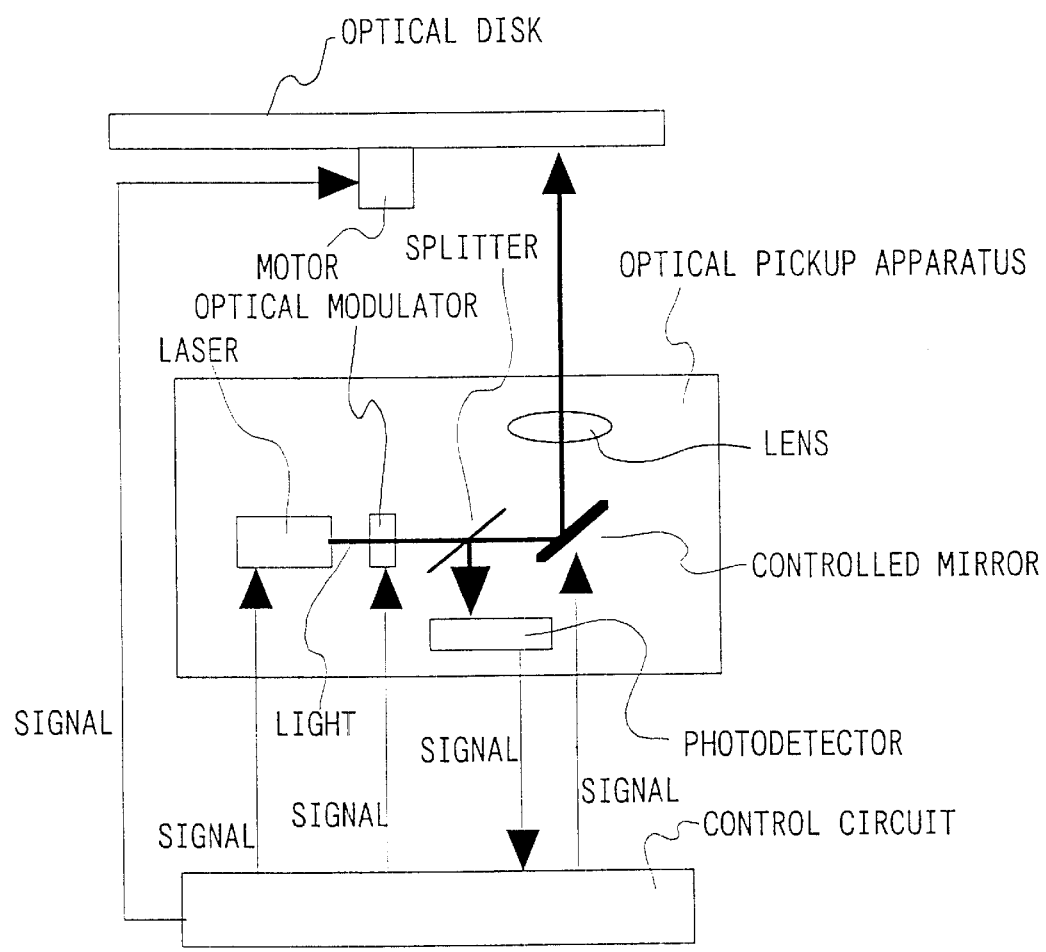
FIG. 7 schematically shows an optical disc apparatus as one example of an information recording apparatus.

FIG. 7 shows an optical disc device employing the nitride semiconductor laser diode device according to the present invention. In the optical disc device, the nitride semiconductor laser emits laser beam, which is transmitted via an optical modulator, a splitter, a follow-up mirror and a lens to illuminate an optical disc. The beam from the splitter is detected by a photodetector. The photodetector outputs a signal which is in turn transmitted to a control circuit. The control circuit sends signals to a motor actuating the disc, the semiconductor laser, the optical modulator and the follow-up mirror, respectively. The laser beam is modulated by the optical modulator in response to information input and recorded on the disc via the lens. In reproduction, laser beam optically changed by pit arrangement on the disc is transmitted though the splitter and detected by the photodetector to form a reproduced signal. This series of operations are controlled by the control circuit. Normally, a laser output of approximately 30 mW is provided in recording and that of approximately 5 mW is provided in reproduction.

Besides the optical disc device as described above, the device according to the present invention is also applicable to laser printers, barcode readers, and projectors using three primary color (blue, red, green) laser diodes.

In the present invention, the impurity added to the light emitting layer can reduce the crystal system separation in the light emitting layer. According to the present invention, the light emitting nitride semiconductor device with a high luminous efficacy can be provided. According to the present invention, such a device is applied to a light emitting apparatus and optical pickup device.

Although the present invention has been described and illustrated in detail, it is clearly understood that the same is by way of illustration and example only and is not to be taken by way of limitation, the spirit and scope of the present invention being limited only by the terms of the appended claims.

What is claimed:

1. A light emitting nitride semiconductor device provided in a form of a nitride semiconductor laser device, comprising:

a substrate made of nitride semiconductor crystal or a substrate having a nitride semiconductor crystal film grown on a crystalline material other than said nitride semiconductor crystal;

an n-type layer and a p-type layer made of nitride semiconductor and formed on said substrate; and a light emitting layer provided between the n-type layer and the p-type layer, wherein said light emitting layer is formed of a well layer or a combination of well and barrier layers;

of said layer or layers forming said light emitting layer, at least said well layer is made of a nitride semiconductor containing an element X, an element Y, and N and Ga, said element X being at least one selected from the group consisting of As, P and Sb, said element Y being at least one selected from the group consisting of Al and In;

in said nitride semiconductor forming said light emitting layer, the ratio of the number of the atoms of said element X to the sum of the number of the atoms of said element X and the number of the atoms of said N, is not more than 30 atomic percent; and of said layer or layers forming said light emitting layer, at least said well layer contains as an impurity at least one element selected from the group consisting of Mg, Be, Zn, Cd, C, Si, Ge, Sn, O, S, Se and Te.

2. The light emitting nitride semiconductor device of claim 1, wherein a total content of said impurity is $1 \times 10^{17}$ to $5 \times 10^{20}/cm^3$.

3. A light emitting apparatus, comprising the light emitting nitride semiconductor device recited in claim 1 and having an oscillation wavelength of 360 nm to 420 nm or an emission wavelength of 360 nm to 650 nm.

* * * * *